(12) United States Patent
Leeser (10) Patent No.: US 6,236,555 B1
(45) Date of Patent: May 22, 2001

(54) METHOD FOR RAPIDLY DECHUCKING A SEMICONDUCTOR WAFER FROM AN ELECTROSTATIC CHUCK UTILIZING A HYSTERETIC DISCHARGE CYCLE

(75) Inventor: Karl F. Leeser, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/294,255

(22) Filed: Apr. 19, 1999

(51) Int. Cl.[7] .................................................. H02N 13/00
(52) U.S. Cl. ............................................ 361/234; 279/128
(58) Field of Search .................................. 361/234, 233, 361/230, 235; 279/128

(56) References Cited

U.S. PATENT DOCUMENTS 5,103,367 * 4/1992 Horwitz et al. ...................... 361/234
5,444,597 * 8/1995 Blake et al. .......................... 361/234
5,486,320 * 1/1996 Bauer .................................... 264/408
5,573,981 * 11/1996 Sato ...................................... 437/225

FOREIGN PATENT DOCUMENTS 63-169244    1/1987 (JP) .

* cited by examiner

Primary Examiner—Fritz Fleming
(74) Attorney, Agent, or Firm—Thomason, Moser & Patterson LLP (57) ABSTRACT

A method for rapidly dechucking a wafer from a chuck by applying a voltage that between the wafer and the electrode that performs a hysteretic discharge cycle such that residual charge is removed. The voltage is a decaying oscillating waveform that provides a decaying electric field at the wafer to chuck surface interface. The form of this field at this interface is very important to achieving rapid dechucking of less than 200 mS.

19 Claims, 6 Drawing Sheets

METHOD FOR RAPIDLY DECHUCKING A SEMICONDUCTOR WAFER FROM AN ELECTROSTATIC CHUCK UTILIZING A HYSTERETIC DISCHARGE CYCLE

BACKGROUND OF THE DISCLOSURE

1. Field of the Invention

The invention relates to a method of rapidly dechucking a semiconductor wafer from an electrostatic chuck. More particularly, the invention relates to a method of dechucking a wafer from an electrostatic chuck by using a hysteretic discharging cycle.

2. Description of the Background Art

Electrostatic chucks (ESC) are used for holding a workpiece in various applications ranging from holding a sheet of paper in a computer graphics plotter to holding a semiconductor wafer within a semiconductor fabrication process chamber. Although electrostatic chucks vary in design, they all are based on the principle of applying a voltage to one or more electrodes in the chuck so as to induce opposite polarity charges in the workpiece and electrode(s), respectively. The electrostatic attractive force between the opposite charges presses the workpiece against the chuck, thereby retaining the workpiece.

One problem that arises with the use of an ESC is the difficulty of removing the residual electrostatic force between the workpiece and the chuck during "dechucking". This residual force results from electric charges having accumulated at the interface between the workpiece and the ESC support surface. One technique for dechucking involves connecting both the electrode and the workpiece to ground. Another technique reverses the polarity of the DC chucking voltage applied to the electrodes to discharge the electrodes. However, these techniques are not completely effective at removing all the charge on the electrodes and the wafer. Consequently, a mechanical force is often needed to overcome the remaining attractive electrostatic force due to residual charges on the electrodes and wafer. At times, the mechanical force used to release the wafer may cause the wafer to "pop", i.e., to be released from the chuck in some unpredictable manner, which may cause either wafer damage or difficulty in retrieving the wafer from unintended position. Therefore, a successful dechucking operation is one which leaves the wafer in a state subject to acceptably low residual electrostatic attractive force without "popping" the wafer.

Furthermore, when using these common dechucking practices that simply remove the potential difference between the electrodes, the time required to dechuck by these methods is defined by the RC time constant of the high voltage electrical circuit as well as the effective charge relaxation time constant of the electrode-wafer system. This time constant is given by the effective resistivity-permitivity product, $\tau_{cr} = \rho \epsilon_o \epsilon_r$, where $\rho$ is the volume resistivity of the dielectric layer between the electrode and the wafer (i.e., the chuck material), $\epsilon_o$ is the permittivity of free space, and $\epsilon_r$ is the relative permittivity of the dielectric layer. The total time required to dechuck by this method is often on the order of several seconds.

Other dechucking methods include applying to the ESC an optimal, but non-zero, dechucking voltage. A commonly-assigned U.S. Pat. No. 5,459,632 issued to Birang et al. on Oct. 17, 1995, and is herein incorporated by reference, discloses a method of determining and applying an optimal dechucking voltage which has the same polarity as that of the chucking voltage. Another method involves determining and applying an optimal dechucking voltage for an optimal dechucking period. This is the subject of another commonly-assigned U.S. Pat. application Ser. No. 08/696,293, filed by Loo on Aug. 13, 1998, and is herein incorporated by reference. Although these prior art dechucking methods are effective at removing the residual charge from the wafer and electrodes, none of these prior art references are concerned with very rapid dechucking, i.e., on the order of a hundred milliseconds.

The need for a rapid dechucking operation is most keenly felt in single wafer processing systems, where the advantage of excellent wafer to wafer uniformity is achieved at the expense of a reduced wafer throughput. In a system such as a single wafer ion implant system, the time required to dechuck a wafer can have a substantial impact on the throughput of the system. In U.S. Pat. No. 5,444,597 issued to Blake et al. On Aug. 22, 1995, a bipolar electrostatic chuck is described that retains a wafer in an ion implant system. The bipolar chuck has a pair of electrodes embedded in the dielectric chuck material and applies a differential voltage to the electrode pair to achieve charge accumulation on the backside of the wafer and, ultimately, an electrostatic force to retain the wafer. The wafer is dechucked by applying a DC voltage having a polarity opposite that of the chucking voltage, then applying a switched DC waveform (in effect, an AC waveform) to remove any residual charge. Because the dechucking voltage is directly connected to the electrode pair and not to the wafer, the wafer forms, in essence, a floating electrode. As such, charge is removed indirectly from the wafer. This removal of charge from the wafer is very difficult and can require a substantial amount of time as the interface discharges.

Additionally, the dechucking duration is exacerbated in systems where the platen supporting the wafer is vertically oriented during wafer processing, e.g., ion implant equipment. In these systems, gravity does not aid the chucking process and, to ensure sufficient wafer retention while moving the platen to a vertical orientation, a very strong chucking force is required. Such a strong chucking force requires a substantial chucking voltage to be applied to the electrostatic chuck, i.e., typically much larger than the chucking voltage used in horizontally oriented chucks. This high chucking voltage causes a substantial residual charge to reside between the wafer and the chuck after the chucking voltage is deactivated. The use of conventional dechucking techniques does not remove this large residual charge in a short period of time. As such, the throughput of the wafer processing system is detrimentally impacted.

Therefore, a need exists in the art for alternative methods for chucking a wafer and rapidly dechucking the wafer from an electrostatic chuck used in a single wafer system.

SUMMARY OF THE INVENTION

The disadvantages of the prior art are overcome by a method and apparatus for dechucking a workpiece from an electrostatic chuck using a hysteretic dechucking cycle. The hysteretic cycle is derived from the well known hysteretic cycle used in magnetic degaussing signals to demagnetize objects such as cathode ray tubes (CRTS). It has been discovered that using a hysteretic cycle for an electric field that is applied to the interface of a workpiece and an electrostatic chuck workpiece support surface will effectively discharge the residual charge to zero or some pre-defined value.

In an illustrative embodiment of the invention, the inventive method is used to discharge a monopolar electrostatic chuck having a single electrode embedded in a dielectric chuck body. To chuck a semiconductor wafer or other workpiece, a wafer is positioned upon the chuck and in contact with a conductive contact. The contact applies a first voltage to the wafer. A second voltage, having a magnitude different from the first voltage, is applied to the electrode within the chuck. The differential voltage from the wafer to the electrode causes charges to accumulate on the wafer and the electrode such that the wafer is retained upon chuck. If the chuck body is fabricated of a semiconductive material such as aluminum nitride, the charges on the electrode migrate to the surface of the chuck body beneath the wafer. As such, the surface charges on the chuck surface and the charges on the backside of the wafer retain the wafer on the chuck. This charge migration effect is known as the Johnsen-Rahbek effect. The Johnsen-Rahbek effect in a monopolar chuck provides a very effective and strong electrostatic force that retains the wafer. However, charge removal is also very difficult for such a chuck.

To rapidly dechuck the wafer from the monopolar chuck, the invention applies a voltage between the wafer and the electrode that performs a hysteretic discharge cycle such that residual charge is removed, i.e., a hysteretic electric field is established at the interface between the wafer support surface of the chuck and the wafer. The voltage used to produce such an electric field is a linearly decaying AC waveform. The form of this electric field at this interface is very important to achieving rapid dechucking of less than 200 mS. A proper discharging field is also achieved using a AC waveform having a linearly increasing frequency (i.e., the waveform is chirped).

The end result of the hysteretic cycle used for discharging an electrostatic chuck is that the chuck, even a monopolar chuck can be discharged very rapidly, i.e., in less than 200 mS. Consequently, a single wafer semiconductor processing system, such as a single wafer ion implant system, can process wafers with a very high throughput.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
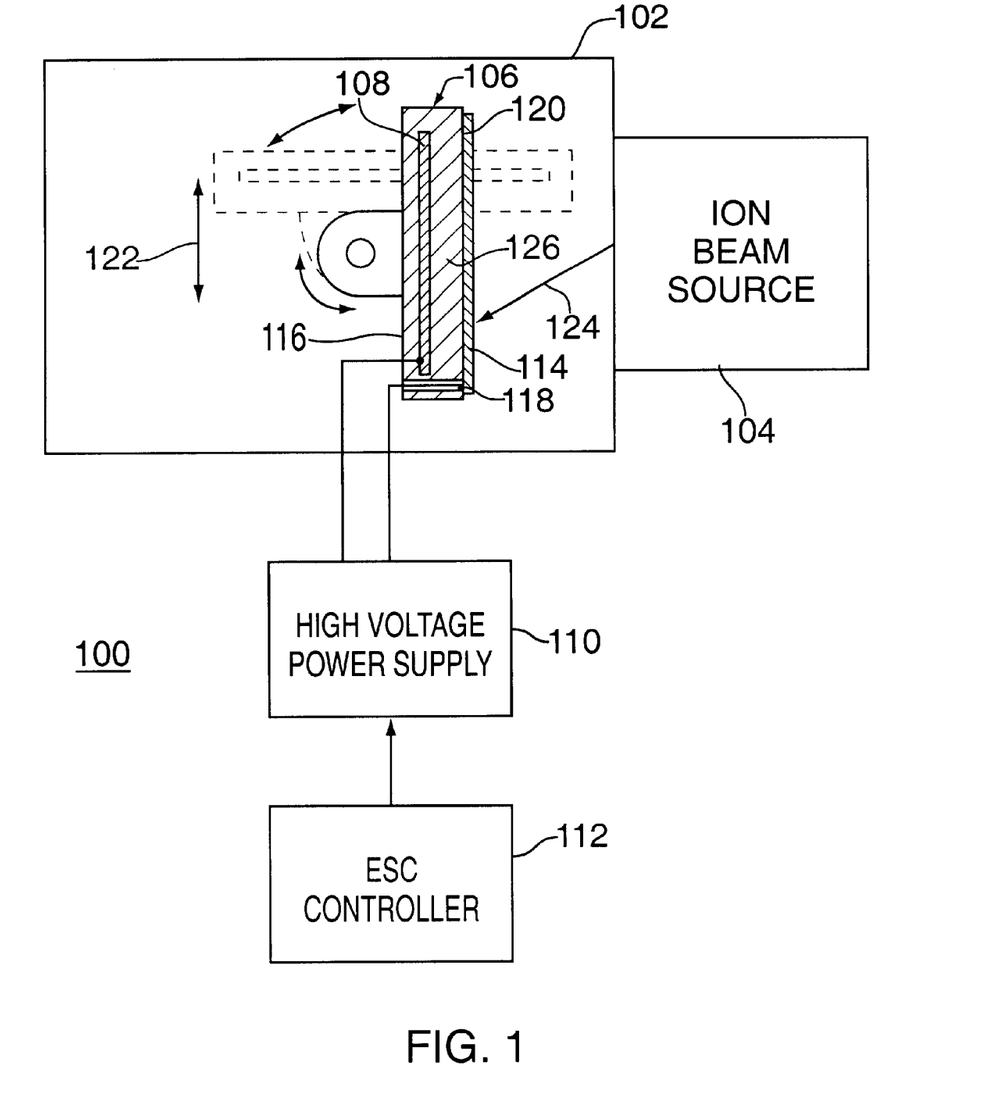
FIG. 1 is a schematic cross sectional view of a semiconductor wafer process apparatus (an ion implant system) having an electrostatic chuck (ESC) for retaining a semiconductor wafer during processing therein.

FIG. 1 is a schematic illustration of a cross-sectional view of a semiconductor wafer processing system 100, for example, an ion implant system containing a monopolar electrostatic chuck (ESC) for retaining a wafer 114 within the system during wafer processing. The ion implant system 102 comprises a vacuum chamber 100, an ion beam source 104, an electrostatic chuck 106, a high voltage power supply 110 and an ESC controller 112. The ESC 106 contains an electrode 108 embedded in a dielectric chuck body 116. The dielectric chuck body 116 is fabricated of cylindrical puck of ceramic material such as aluminum nitride. Other dielectric materials can also be used, such as aluminum nitride, boron-nitride, and alumina, each doped with a titanium oxide or a chromium oxide to promote the Johnsen-Rahbek effect (as described more fully below).

The electrode 108 is a plate or layer of a conductive material such as molybdenum. The electrode 108 is connected to one terminal of the high voltage power supply 110. The other terminal of the supply 110 is connected through the chuck body to a surface electrode or pin 118 extending from a wafer support surface 120. The pin 118 is designed to contact the backside of the wafer 114 such that the chucking voltage, e.g., 500 VDC, is applied by the supply 110 to the electrode 108 on the wafer 114.

Once a chucking voltage is applied, charges migrate from the electrode 108 to the surface 120 of the chuck body and opposite charges are induced on the backside of the wafer such that the wafer is chucked by the Johnsen-Rahbek effect. The Johnsen-Rahbek effect is discussed in detail in U.S. Pat. No. 5,117,121 issued May 26, 1992. The chucking force produced by the Johnsen-Rahbek (J-R) effect is very strong and permits the chuck to be positioned vertically and mechanically moved from a horizontal position (shown in phantom) to a vertical position without the wafer moving across the surface of the chuck. While in the vertical position, the chuck is physically moved in the vertical plane (as indicated by arrow 122) and the ion beam 124 is scanned horizontally such that all locations on the wafer can be exposed to the ion beam 124.

Although a J-R monopolar chuck is described as one illustrative type of electrostatic chuck that can be used with the invention, any electrostatic chuck that requires rapid discharge of a residual charge will find the present invention useful. Such chucks include bipolar chucks, dielectric chucks, multi-electrode chucks, non-Johnsen-Rahbek chucks, and the like.

The present invention is a method of rapid dechucking of the semiconductor wafer 114 by applying a hysteretic discharge cycle to the ESC 106. As a point of reference, rapid dechucking time for a ceramic ESC used in an ion implant system is on the order of less than 200 msec.

The problem of "memory effect", due to residual charges, occurs due to a fundamental hysteretic charging behavior of the wafer-ESC interface (along surface 120 of the chuck 106) and a region 126 between the electrode 108 and the ESC surface 120. This "memory effect" has multiple sources. For sufficiently low fields, the material is electrostatically "elastic" and retains no residual charge once the applied field is removed. However, for sufficiently large fields, a "plastic" behavior is seen and some residual charge remains even when the applied field no longer exists, i.e., after the chucking voltage is removed. While this hysteretic behavior has long been used to produce magnetic memory devices, overcoming this memory effect is also one of the long-standing challenges in developing methods for rapid dechucking.

Figure 2A:
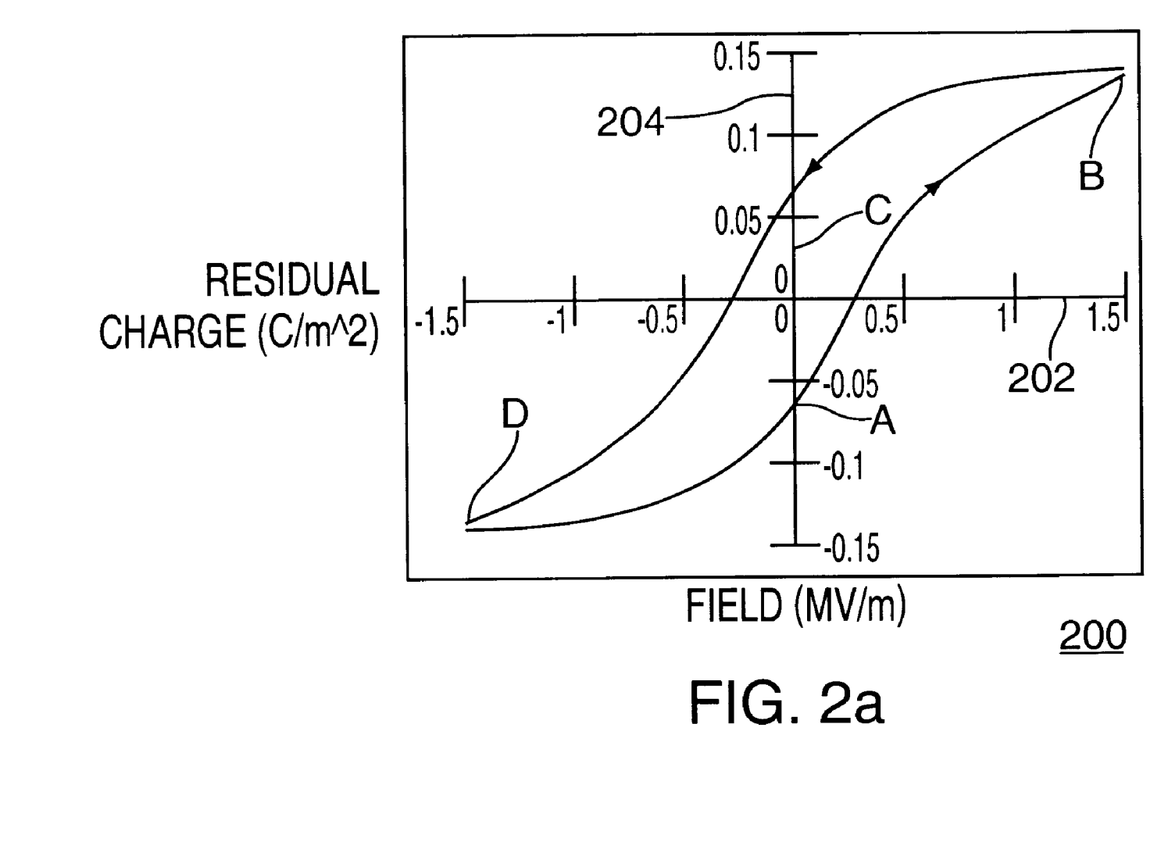
FIG. 2a depicts a map of residual charge vs. applied field for an ESC.

This hysteretic behavior can be illustrated by a field-charge hysteresis curve 200, which is shown in FIG. 2a, where the residual charge 202 on an ESC is plotted as a function of the applied electric field 204. The charge on the ESC follows the path AB when an increasing voltage of positive polarity is applied to the electrode-wafer. Upon decreasing the voltage, the ESC charge follows the path BC, instead of BA, because of hysteresis. Applying a similar voltage cycle at a reversed polarity brings the ESC charge along the paths CD and DA, thus completing a full hysteretic cycle. Note however, that the shape of this hysteresis curve is also time dependent, because the residual charge on the ESC will, after the applied voltage is removed from the electrode, dissipate over time due to natural charge leakage.

This charge leakage, or relaxation term is given by $q=CVe^{-t/\tau cr}$ in Equation (1), which shows that as time approaches infinity, the surface charge becomes zero. This time-dependency of the hysteresis curve can therefore be represented in a three-dimensional plot, with the time axis being orthogonal to the charge and field axes 202 and 204 shown in FIG. 2a. One can think of the true hysteresis curve as having the shape of a tube, or a sock, of decreasing cross section at larger time slices. Equivalently, the shape of the hysteresis curve is frequency dependent.

The technique of degaussing, which involves applying an external field to drive a magnet through its magnetization curve similar to that shown in FIG. 2a, has been used successfully for demagnetizing a magnet. A similar technique can also be used to return any "electret" to a zero charge state from any initial charge state. An electret is the electrostatic analogue of the magnet. Drawing from this analogy, a ferrous material can be made into a permanent magnet by subjecting the material to a magnetic field. Once removed from this field, the material retains a magnetic moment. Similarly, a dielectric material can be subject to an electrostatic field and made to retain charge once removed from this field. Just as in the magnetic case, the electret effect can be exacerbated by application of a strong electric field, suitable choice of a susceptible material and by increasing molecular mobility, usually by subjecting the material to elevated temperature or increasing exposure time. Thus, a hot process with an ESC provides fertile ground for the formation of an electret.

In degaussing an electret, a decaying, periodic signal is used to cyclicly and gradually reduce the field seen by the electret (the wafer-ESC interface). The technique works because of the time and field dependence of the hysteresis. However, its effectiveness is determined by the amplitude decrement and frequency.

Indeed, this hysteretic behavior can advantageously be applied to the dechucking operation of an ESC, by subjecting the ESC to an alternating field whose magnitude, or peak amplitude, decreases over time. If the ESC is driven through a discharge voltage period having a peak amplitude (i.e., values of the field at B and D) which decreases with time, one can see the ESC hysteretic loop will become increasingly smaller upon successive cycles. In a dechucking operation, the complete discharge cycle ends when the applied peak voltage approaches zero, and the ESC is left at a zero residual charge state (or some predefined level). The hysteretic response for the ESC during such a dechucking operation is illustrated in FIG. 2b, where the ESC charge follows the path ABCD-EFGH, and so on, until it reaches the zero charge state at the end of the discharge voltage cycle.

Figure 2B:
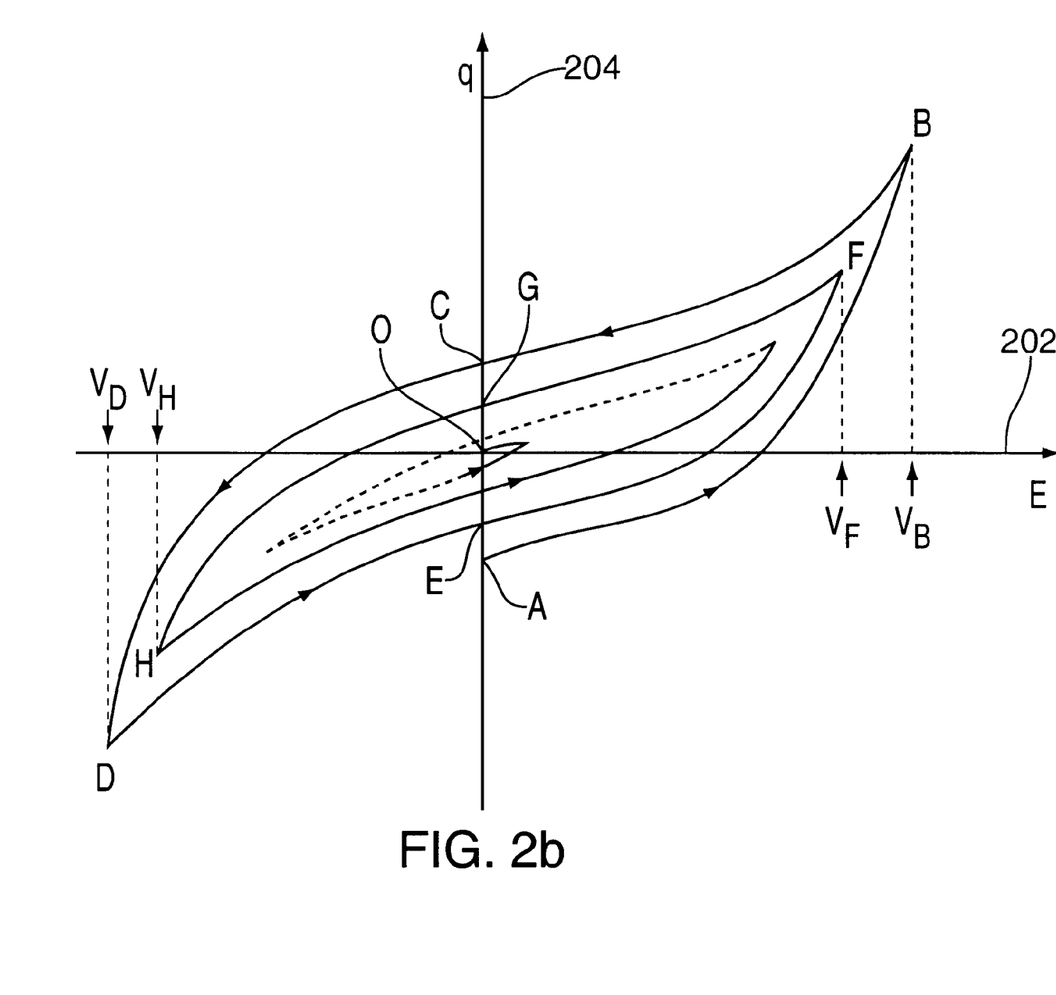
FIG. 2b is an illustrative plot of the hysteretic loop showing the residual charge vs. applied discharge voltage during a discharge cycle of an ESC.
Figure 3A:
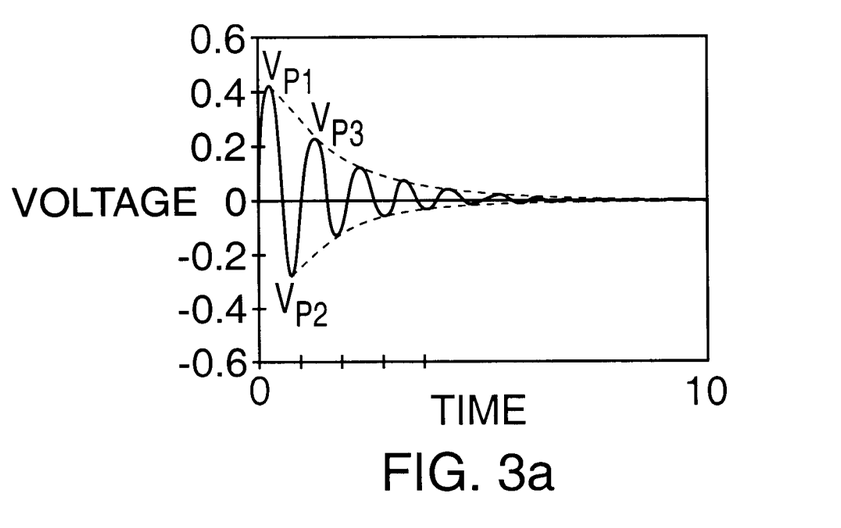
FIG. 3a illustrates an example of a degaussing signal waveform with a logarithmically decreasing sinusoidal profile.
Figure 3B:
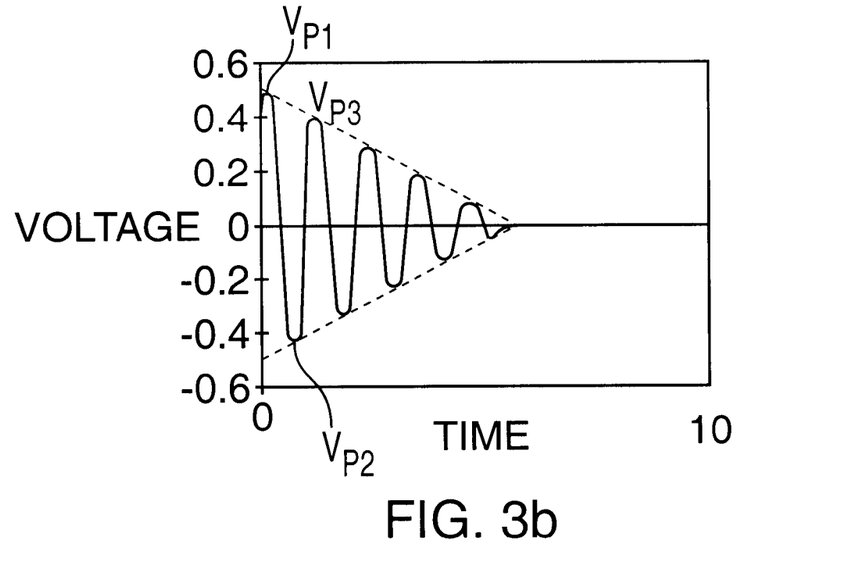
FIG. 3b illustrates an example of a degaussing signal waveform with a linearly decreasing square wave profile.

Many different signal waveforms can be used as the discharge voltage for discharging an ESC, as long as they are applied in a periodic fashion that achieves the discharge path of FIG. 2b. In one embodiment of the invention, the discharge waveform is oscillatory (sinusoidal) with a peak amplitude that decreases with time. FIGS. 3a and 3b illustrate two possible signal profiles. FIG. 3a is a discharging signal waveform with a periodic sinusoidal oscillation whose peak amplitude decreases logarithmically as a function of time. That is, the peak amplitude in FIG. 3a can be represented by:

$$V(t)=V_0 e^{-t/\tau}\cos(2\pi f t)+V_x \qquad \text{Eq. (3)}$$

where $V_o$ is the first peak value (generally the same or slightly larger than the magnitude of the chucking voltage), f is the frequency of the sinusoidal signal, $\tau$ is the "1/e" time associated with the exponential decay envelope (shown as dashed line) and $V_x$ is the final voltage value after discharge is complete. The value of $V_x$ may be zero or non-zero In this illustration, the peak amplitude V(t) 20 decreases from its first maximum value of $V_o$ at t=¼f to $V_{p2}$ at t=¾f. During the subsequent period, this peak amplitude further decreases for each successive half-time period according to an exponential function, until it becomes $V_x$ after many time periods. The condition of the electrostatic chuck being at the charge state corresponding $V_x$. If $V_x$ is zero then the charge state corresponding to zero attractive force represents the "dechucked" state, and the corresponding time duration for the system to reach this dechucked state is the dechucking time $t_d$. Of course, if a non-zero attractive force is desired at the end of the dechucking period, then the "dechucked" state has a corresponding non-zero charge. In many applications for electrostatic chucks, all of the charge may not require removal to enable the wafer to be removed from the chuck, i.e., a nominal residual charge may be overcome by a wafer transfer mechanism (lift pins, wafer gripper robot, and the like). As such, the residual charge is reduced to a non-zero, nominal level that permits wafer removal. By not discharging the residual charge to zero the overall dechucking time is shortened. Additionally, a residual nonzero force may be useful in applications where the workpiece may slide off the chuck surface unless some force retains the workpiece until a workpiece manipulator can retrieve the workpiece from the chuck. Or, a residual charge may be desirable to repel charged particles from the chuck surface after the wafer is removed from the chuck.

The present invention generally provides a discharge cycle having a signal waveform such that this zero charge state (or nominal charge state) can be achieved for the electrostatic chuck system within a predetermined, or desired, dechucking time $t_d$. Of course, the desired dechucking time may vary depending on the specific process application. In general, a shorter dechucking time is desirable because it translates directly to an increased process throughput.

Another signal profile suitable for use as a dechucking voltage is illustrated in FIG. 3b. Similar to the case in FIG. 3a, the signal is periodic in nature, except that the peak amplitude in FIG. 3b decreases linearly as a function of time. That is, $$V(t) = \begin{cases} V_0(1 - t/t_0)\cos(2\pi ft) + V_x & \text{for } t < t_0 \\ 0 & \text{otherwise} \end{cases},$$

where $t_o$ is a time in which the envelope is designed to reach $V_x$ as illustrated by the dashed line, and f is the frequency of oscillation.

Although both of these profiles shown in FIGS. 3a and 3b are open loop in the control sense, i.e., the signal is applied to the electrode without any control feedback as to the charge condition of the chuck, the discharging method is stable and convergent if the following two conditions are satisfied: 1) the initial field magnitude is greater than or equal to the greatest field experienced by the electret prior to the dechucking step; and 2) the frequency of oscillation is sufficiently low. This result occurs because all state trajectories are asymptotically captured in the diminishing magnitude envelope. In terms of nonlinear dynamics, all possible state trajectories are "attracted" to this particular state trajectory.

Figure 4:
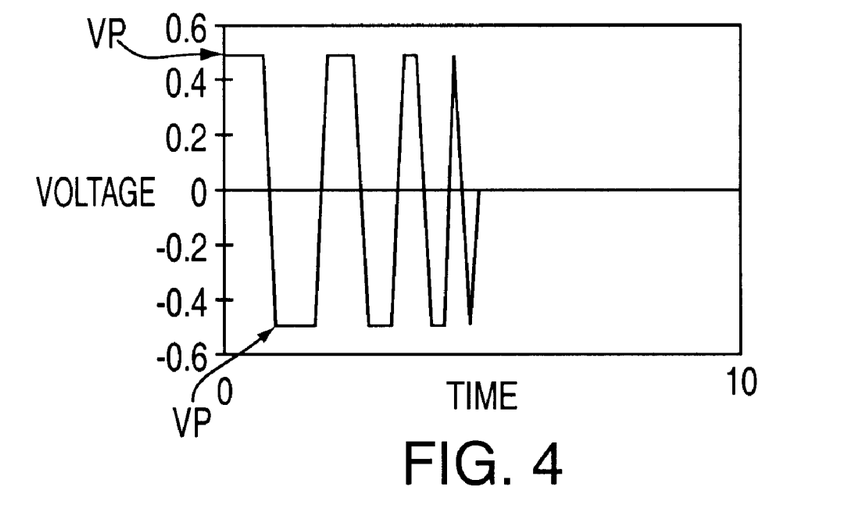
FIG. 4 illustrates an example of a degaussing signal waveform with an increasing frequency "chirp" signal of constant amplitude.
Figure 5:
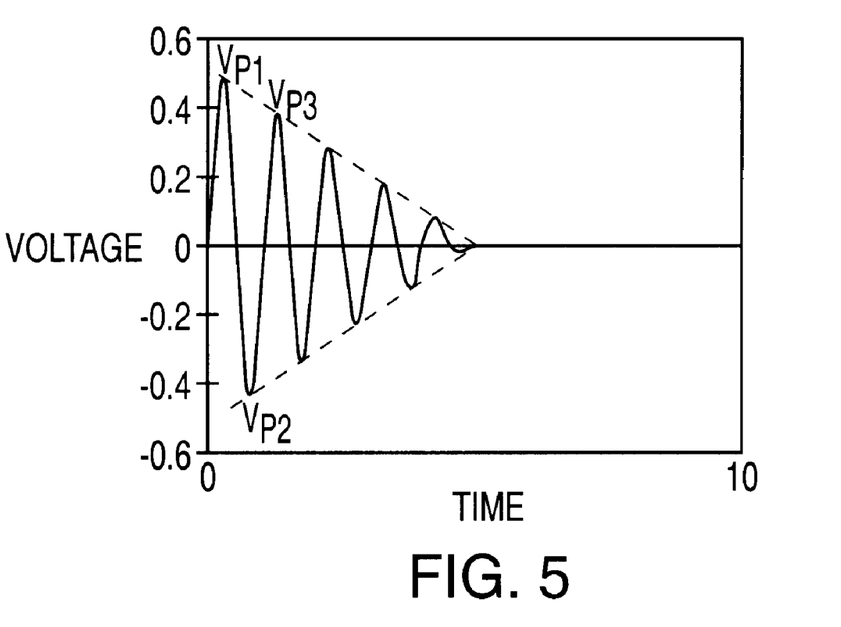
FIG. 5 illustrates an example of a degaussing signal waveform with a linearly decrementing, sinusoidal profile.

Another alternative discharging waveform is shown in FIG. 4. Unlike the profiles shown in FIGS. 3a and 3b, this particular signal profile has a peak amplitude which remains constant over time. It also incorporates an increasing frequency "chirp", i.e., a positive frequency change which increases with time. For example, the frequency may vary from 100 Hz to 100 KHz. Since the ESC system inherently incorporates multiple first order lags, the voltage experienced by the ESC surface is actually an attenuated version of the power supply (applied) signal. Furthermore, due to the dielectric material this attenuation increases with increasing frequency, and an applied signal having a constant peak amplitude, but variable frequency "chirp", will produce an effective oscillating signal with a decaying peak amplitude at the interface of the ESC and the wafer. Therefore, this particular embodiment illustrates that the applied field is only of "secondary" importance when compared to the field actually experienced at the interface of the chuck surface and the wafer. As long as the effective peak voltage at the ESC-wafer interface is caused to oscillate and decrease with time, a dechucking operation using the present invention can result in a zero charge state (or a predefined charge state) at the end of the dechucking voltage cycle, even if the applied voltage is maintained at a constant peak amplitude.

The use of a decaying sinusoid signal for discharging the ESC is subject to certain frequency limitations due to the inherent first order lag between the surface charge accumulation and the charge accumulation at the electrodes. For example, it has been found experimentally that too fast a discharging frequency will result in some residual surface charge. In one experiment, an aluminum nitride (Johnsen-Rahbek) ESC was charged to 200 volts. The ESC electrodes were disconnected from the power supply and simultaneously shunted to an RL network, resulting in an exponentially decaying sinusoidal oscillation in electrode potential. The frequency of oscillation was between 100 and 200 kHz. If the shunt was temporarily removed and reapplied a few seconds later, another decaying sinusoidal potential trace could be seen, but starting at a lower voltage, typically about 40 volts. This process could be repeated several times, each subsequent trial resulting in a lower initial voltage. This experiment suggests that for a given decay envelop, there is an optimal frequency which would result in the desired dechucking time and simultaneously lead to a zero residual charge. From this experiment, a method of passively dechucking a wafer can be derived by providing a shunting circuit with a RL time constant selected to give an oscillation frequency close to the estimated optimal value.

Figure 6:
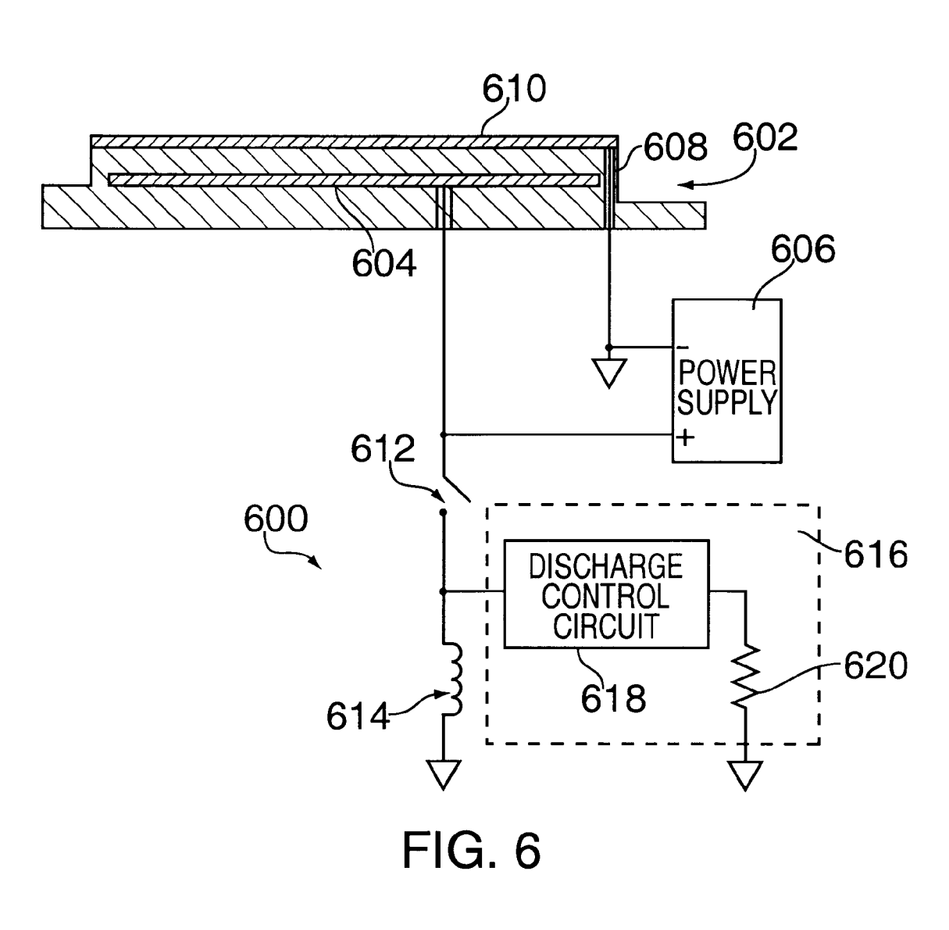
FIG. 6 depicts a schematic diagram of a passive dechucking circuit.

FIG. 6 depicts a schematic of a passive dechucking circuit 600 coupled to an electrostatic chuck 602. The electrode 604 or electrode(s) of the electrostatic chuck 602 are driven by a power supply 606. In the illustrative monopolar chuck, the electrode 604 is connected to one polarity of a DC power supply 606 and the other polarity (ground) is connected to a contact 608 that conductively contacts the wafer 610 in one or more locations on the backside of the wafer 610. The dechucking circuit 600 comprises a switch 612, an inductor 614 and a resistive load 616. The resistive load 616 contains a discharge control circuit 618 connected to a resistor 620. The discharge control circuit 618 may be an active or passive circuit that controls the amount of energy dissipated by the resistor 620 during each cycle of the oscillatory discharge signal. In this embodiment of the invention, the oscillatory signal is passively generated, in that, the wafer-chuck interface forms a capacitor that discharges its stored energy through an inductive load thus producing a resonant circuit. The resistor 620 dissipates energy from the resonant circuit during each cycle of oscillation. As such, the resistor controls the decay profile of the oscillating waveform that produces the electric field having a hysteretic cycle at the after-chuck interface.

The resistive value can be dynamically adjusted by the discharge control circuit 618 to achieve an optimal profile for the decaying signal. For example, the impedance may be linearly varying over time by using a positive temperature coefficient (PTC) resistor such that a different amount of energy is removed from the ESC-wafer interface with each cycle (i.e., the discharge control circuit and resistor would be a single device in a PTC resistor). Alternatively, to remove a fixed quantity of energy at every cycle, a pair of oppositely polarized diodes connected in parallel are connected in series with the resistor 620. Another example would be to use an active control circuit such as a transistor circuit to control the dissipation during each cycle. Of course, the foregoing discharge control circuits are merely examples of the myriad of possible circuits that those skilled in the art could derive to control the amount of energy dissipated by the resistive load and thus control the profile of the decaying signal. All such circuits should be considered within the scope of the invention.

Although various embodiments which incorporate the teachings of the present invention have been shown and described in detail herein, those skilled in the art can readily devise many other varied embodiments that still incorporate these teachings.

What is claimed is:

1. A method of chucking and dechucking a workpiece from an electrostatic chuck comprising the step of:

applying a chucking voltage to an electrode within said electrostatic chuck to electrostatically retain said workpiece upon a workpiece support surface of the electrostatic chuck;

applying a dechucking voltage having an oscillating waveform to said electrode to produce an electric field having a hysteretic cycle between the workpiece and the workpiece support surface of the electrostatic chuck, said oscillating waveform having a non-linearly decaying envelope, and whereby the electric field having a hysteretic cycle discharges charges that have accumulated between the workpiece and the workpiece support surface of the electrostatic chuck.

2. The method of claim 1 wherein said electrostatic chuck is a monopolar electrostatic chuck having said chucking and dechucking voltages applied across the workpiece and an electrode within the electrostatic chuck.

3. The method of claim 1 wherein the chucking voltage is a DC voltage.

4. The method of claim 1 wherein said dechucking voltage has a peak amplitude which diminishes with time.

5. The method of claim 1 wherein said dechucking voltage has a peak amplitude which linearly diminishes with time.

6. The method of claim 1 wherein said dechucking voltage increase in frequency with time.

7. The method of claim 1 wherein said dechucking voltage is passively produced using energy stored between the workpiece and electrostatic chuck.

8. The method of claim 7 wherein the stored energy is discharged through a resistive and inductive loading circuit, where the resistance of a resistive element is defined to produce a specific discharge profile.

9. The method of claim 8 further comprising the step of actively controlling the resistance of the resistive element during discharge.

10. In an ion implant system having a monopolar electrostatic chuck, a method of chucking and dechucking a semiconductor wafer comprising the steps of:

applying a chucking voltage to an electrode within said electrostatic chuck to electrostatically retain said semiconductor wafer upon a wafer support surface of the electrostatic chuck;

processing said semiconductor wafer;

applying a dechucking voltage having an oscillating waveform to said electrode to produce an electric field having a hysteretic cycle between the semiconductor wafer and the wafer support surface of the electrostatic chuck, said oscillating waveform having a non-linearly decaying envelope, and whereby the electric field having a hysteretic cycle discharges charges that have accumulated between the semiconductor wafer and the wafer support surface of the electrostatic chuck.

11. The method of claim 10 wherein the chucking voltage is a DC voltage.

12. The method of claim 10 wherein said dechucking voltage has a peak amplitude which diminishes with time.

13. The method of claim 10 wherein said dechucking voltage has a peak amplitude which linearly diminishes with time.

14. The method of claim 10 wherein said dechucking voltage increase in frequency with time.

15. The method of claim 10 wherein said dechucking voltage is passively produced using energy stored between the workpiece and electrostatic chuck.

16. The method of claim 15 wherein the stored energy is discharged through a resistive and inductive loading circuit, where the resistance of a resistive element is defined to produce a specific discharge profile.

17. The method of claim 16 further comprising the step of actively controlling the impedance of the resistive element during discharge.

18. Apparatus for dechucking a workpiece from an electrostatic chuck having at least one electrode comprising:

an inductor selectively coupled between said at least one electrode and ground;

a resistive element, selectively coupled between said at least one electrode and ground, having a resistance value that produces a specific discharge voltage profile for energy stored between said workpiece and a workpiece support surface of said electrostatic chuck, and wherein the resistive element is actively controlled to dissipate specified amounts of energy.

19. Apparatus for dechucking a workpiece from an electrostatic chuck having at least one electrode comprising:

an inductor selectively coupled between said at least one electrode and ground;

a resistive element, selectively coupled between said at least one electrode and ground, having a resistance value that produces a specific discharge voltage profile for energy stored between said workpiece and a workpiece support surface of said electrostatic chuck, wherein said resistive element contains an active control device and a resistive load device, wherein the active control device controls an amount of energy to be dissipated by the resistive load device.

* * * * *